United States Patent [19]

Lusignea et al.

[11] Patent Number: 4,871,595

[45] Date of Patent: Oct. 3, 1989

[54] LYOTROPIC LIQUID CRYSTALLINE ORIENTED POLYMER SUBSTRATE FOR PRINTED WIRE BOARD

[75] Inventors: Richard W. Lusignea, Brighton; William A. Stevenson, Concord, both of Mass.

[73] Assignee: Foster Miller, Inc., Waltham, Mass.

[21] Appl. No.: 942,150

[22] Filed: Dec. 16, 1986

[51] Int. Cl.$^4$ .............................................. C09K 19/00
[52] U.S. Cl. ........................................ 428/1; 156/150; 156/151; 156/330; 156/330.9; 174/68.5; 427/98; 428/901; 428/910; 525/903; 528/373; 548/152
[58] Field of Search ............ 156/150, 330, 151, 330.9; 525/903; 528/373; 427/98; 428/901, 910, 1; 29/832; 526/257; 548/152; 174/68.5

[56] References Cited

U.S. PATENT DOCUMENTS

| | | | |
|---|---|---|---|
| 3,595,736 | 7/1971 | Buteux | 428/910 |
| 3,598,637 | 8/1971 | Stoll et al. | 428/910 |
| 3,681,297 | 8/1972 | D'Alelio | 548/152 |
| 4,041,206 | 8/1977 | Tsunashima et al. | 428/910 |
| 4,353,954 | 10/1982 | Yamaoka et al. | 174/68.5 |
| 4,569,885 | 2/1986 | Yamaguchi et al. | 428/910 |

*Primary Examiner*—John J. Gallagher
*Attorney, Agent, or Firm*—David G. Conlin; Linda M. Buckley

[57] ABSTRACT

The present invention is directed to the use of ordered polymers as a substrate material for the preparation of printed wire boards (PWB). In preferred embodiments, the PWB of the present invention comprises a generic, high density, organic multilayer PWB capable of being employed as a high density leadless perimeter and in grid array ceramic chip packages. Specific chip package density requirements are 0.020-in. centers with up to 300 input/outputs (I/Os) for perimeter type packages and 0.050-in. center grid array type packages with up to 240 I/Os per device. In its most preferred embodiments, the present invention is directed to a method of forming a PBT PWB substrate layer of 0.0025 in. or less in thickness. Another preferred aspect of the present invention concerns the discovery that a copper layer can be bonded to a PBT film substrate with a strength comparable to existing PWB materials.

20 Claims, 7 Drawing Sheets

FIG. 1 a) PLANAR ISOTROPIC (POLYMER RODS LIE IN 1-2 PLANE)

b) UNIAXIAL ORIENTATION, ALL MOLECULES ORIENTED IN THE MACHINE DIRECTION c) BALANCED ANGLE BIAXIAL ORIENTATION, MOLECULES ORIENTED AT $\pm\theta$ TO THE MACHINE DIRECTION

WET COAGULATED PBT MICRO STRUCTURE

LYOTROPIC LIQUID CRYSTALLINE ORIENTED POLYMER SUBSTRATE FOR PRINTED WIRE BOARD

STATEMENT OF GOVERNMENT SUPPORT

Funding for this invention was provided in part by the Government of the United States of America, through Contract No. F33615-85-C-5121, by the Department of the Air Force. The Government has certain rights in this invention.

BACKGROUND OF THE INVENTION

The present invention is directed to the use of ordered polymers as a substrate material for the preparation of printed wire boards (PWB). Major advances have recently been made in progressing from conventional dual in-line packages (DIP) to direct surface mounting packages (DSM).

DIPs are generally limited in size by the large pins which must be mounted through holes in the circuit board. DSMs can be mounted on both sides of the boards and have both more and smaller input/output (I/O) connections.

The full benefits of increased speed and reduced size and weight in PWBs have not yet been realized because interconnection of DSM devices has not kept pace with I/O density and the reduction in size possible with leadless perimeter and grid array packages.

One of the major problems of using leadless ceramic chip carriers in advanced avionics (VHSIC and VLSI) applications is the mismatch between the coefficient of thermal expansion (CTE) of alumina chip carriers (6.4 ppm/°C.) and conventional glass/epoxy substrates (12 to 17 ppm/°C.). This mismatch results in work-hardening and cracking of solder joints which attach the DSM chips to the substrate.

Thermal cycles as extreme as $-65$ to $+125C.$ may be encountered and are known to cause solder failure and other damage. As demonstrated herein, ordered polymer films can solve this problem because they can be matched to the ceramic CTE. Moreover, ordered polymers have excellent dielectric properties, and thin biaxially oriented films can be produced which show significant advantages over other high performance substrates.

Fiber reinforced substrates (Kevlar and graphite reinforcement) are being developed to match the ceramic CTE, but these materials have drawbacks. Fibers must be woven into a fabric, or cross-plied resulting in increased thickness and anisotropy at a relatively large scale (fiber tow diameters are about 0.002 in., minimum fabric thickness is about 0.0045 in.). Additional problems of high dielectric constant and costly manufacturing are discussed below.

Copper-Invar-Copper (CIC) laminated foils can provide matched CTE, but these materials are relatively heavy (this precludes their use in avionics applications) and require insulation on the surface and inside vias (holes which connect multilayers).

Ceramic substrates are not considered because their brittleness and high dielectric constant (9-10) rule them out. Recently, Hitachi, Inc., has reported low CTE polyimide film, for example Numota et al., "Chemical Structures and Properties of Low Thermal Polyimides," p. 492–510, *Proceeding of the Second International Conference on Polyimides*, Society of Plastics Engineers, Inc., (1985), but the material is still in the early development stages and sample quantities have not been evaluated.

Polyimide films also suffer from high moisture absorption (5 percent by weight) which degrades dielectric performance and causes hygroscopic expansion.

Advanced computer systems are dependent upon very high density circuit boards having a large number of internal plane, many conducting circuit lines, and a multitude of holes formed in close proximity to the internal conductors. Using present materials and conductor technologies, minimum conductor widths of 3 mil and 3 mil spacings are possible at best. Higher density PWBs are needed to meet the increasing density of circuits packages on semiconductor devices and modules.

SUMMARY OF THE INVENTION

Ordered polymer films, preferably made from polybenzobisthiazole (PBT) can be used as the substrate for printed wire boards and advanced interconnects to fill the current gap in such materials.

The most preferred PBT wire board substrate of the present invention is a non-electrically conducting, low-moisture absorption, multi-layer PWB laminate made from PBT which has the following properties:

Tailorable coefficient of thermal expansion (CTE) (X-Y direction) in range of from about 3 to $7 \times 10^{-6}$ in./in./°C.

CTE of thickness (Z direction) approaching that of the copper used for the plated through holes.

Low-moisture absorption, i.e., not to exceed about 0.5 percent at saturation.

Maximum thickness of a single layer not to exceed 0.0025 in.

Interlaminar shear strength shall be greater than glass/Kerimid 601 or equal to glass/epoxy.

Flexural strength equivalent to glass/polyimide.

Dielectric constant not to exceed about 3.5 over the functional frequency range of 1 kHz to 500 MHz, other electrical properties similar to standard glass/polyimide.

In preferred embodiments, the PWB of the present invention comprises a generic, high density, organic multilayer PWB capable of being employed as a high density leadless perimeter and in grid array ceramic chip packages.

Specific chip package density requirements are 0.020-in. centers with up to 300 input/outputs (I/Os) for perimeter type packages and 0.050-in. center grid array type packages with up to 240 I/Os per device.

In its most preferred embodiments, the present invention is directed to a method of forming a PBT PWB substrate layer of 0.0025 in. or less in thickness, which can meet or exceed the previously specified property requirements. Measurements of specific desired properties, such as CTE, are conducted using ASTM D-696 or its equivalent and dielectric constant measurements are conducted using ASTM D-150 or its equivalent.

Another preferred aspect of the present invention concerns the discovery that a copper layer can be bonded to a PBT film substrate with a strength comparable to existing PWB materials as specified in MIL-P-13949/2A.

The techniques of plasma coating and ion plating are both additive processes which are directly applicable to fine line wiring to the PWB.

Another preferred aspect of this invention involves the discovery that PBT films can be bonded together to form a suitable laminate for multilayer board (MLB) construction.

The substrate surface preparation techniques of this invention are essential to the development of suitable lamination technology.

DETAILED DESCRIPTION OF THE PREFERRED EMBODIMENTS (Samples of PBT film were processed under a variety of processing conditions, each of which yielded varying degrees of molecular orientation.)

Orientations investigated included uniaxial, balanced angle biaxial of ±43 deg., and random. Samples of films produced were tested to determine the CTE in both the machine and transverse directions. These samples were also investigated to determine the dielectric constant.

The CTE data was input to an analytical model that approximates the behavior of a biaxial PBT film as a composite of hypothetical uniaxial plies. The model showed good agreement with the experimental results.

Highly oriented PBT film has a negative CTE in the direction of orientation and a positive CTE in the direction of orientation and a positive CTE transverse to that direction.

A significant discovery of this invention was that the anisotropic thermal expansion behavior can be used to tailor the overall CTE of biaxially oriented films, and these films can be used to make useful PWB substrates with an in-plane CTE of from about +3 to $+7 \times 10^{31\ 6}$ in./in./°C.

In another aspect of the present invention, PBT films were coated with highly adherent copper layers by two techniques:

(1) Ion plating involving the ionic transfer of copper from a solid by sputtering and subsequent deposition on the PBT film substrate by atomic and ionic bombardment.

(2) Electroless plating wherein a catalyst is applied to the PBT film with subsequent deposition of copper from an electroless plating solution.

Both techniques produce coatings about 5 microns thick. Thicker copper cladding suitable for conductors (over 25 microns) can be made by conventional electroplating over the thinner coatings.

The peel strength of plated copper PBT layers was measured at 2 to 4 lb/in., which is low compared to typical glass/epoxy circuit boards. However, this peel strength can be significantly improved by surface treatment of the PBT film.

Another preferred embodiment of the present invention involves the use of PBT films to form a laminate suitable for multilayer boards (MLB).

In connection with this aspect of the invention, a number of alternate surface treatments and adhesives were evaluated. The results of both epoxy and polyimide adhesives indicated that a surface modified PBT, i.e., PBT film whose surface was treated with either a dichromate or a sulfuric acid etch, or by simple mechanical abrasion, adhesion is adequate for MLB applications.

An alternative bonding technique which does not require surface treatment also showed promising results. This method involves modifying the PBT film, resulting in a "pre-preg" or pre-impregnated film which can be subsequently bonded.

DETAILED DESCRIPTION OF THE PREFERRED EMBODIMENTS

The rod-like molecules of PBT and other ordered polymers give rise to a self-reinforced microstructure which can be oriented to control the CTE. Thus, the ordered polymer substrate CTE can be matched to that of the ceramic chip carriers, eliminating fracture at the solder joints of DSM components.

The present invention is based upon the discovery that PBT film has an inherent negative CTE and is quite stiff, making it useful in conjunction with positive CTE metallic ground planes, thermal control layers, signal layers, and laminating resins.

Test data and calculations show that PBT film can be used in advanced PWBs to achieve 6 ppm/°C., matching leadless ceramic chip carriers.

Test data also indicate that PBT film has the capability for high signal propagation speeds (dielectric constant less than 3.0), and low loss of electrical signal into the substrate (dissipation factor less than 0.010).

Other properties which make PBT film an attractive material for advanced PWBs are:

Surface smoothness is not affected by fiber size and does not show micro-cracking as in fabric-reinforced composites;

Film thickness $\leq 2$ mils can easily be achieved, as opposed to a minimum of 3.5 mils for composites;

Very high temperature capabilities for both manufacturing (plating and soldering) and service;

High strength and stiffness for good mechanical properties needed in lightweight high performance boards and Low moisture pickup and excellent environmental resistance.

To understand the tailorable CTE of PBT ordered polymer films, it is necessary to review the processing and morphology of these materials.

Figure 1:
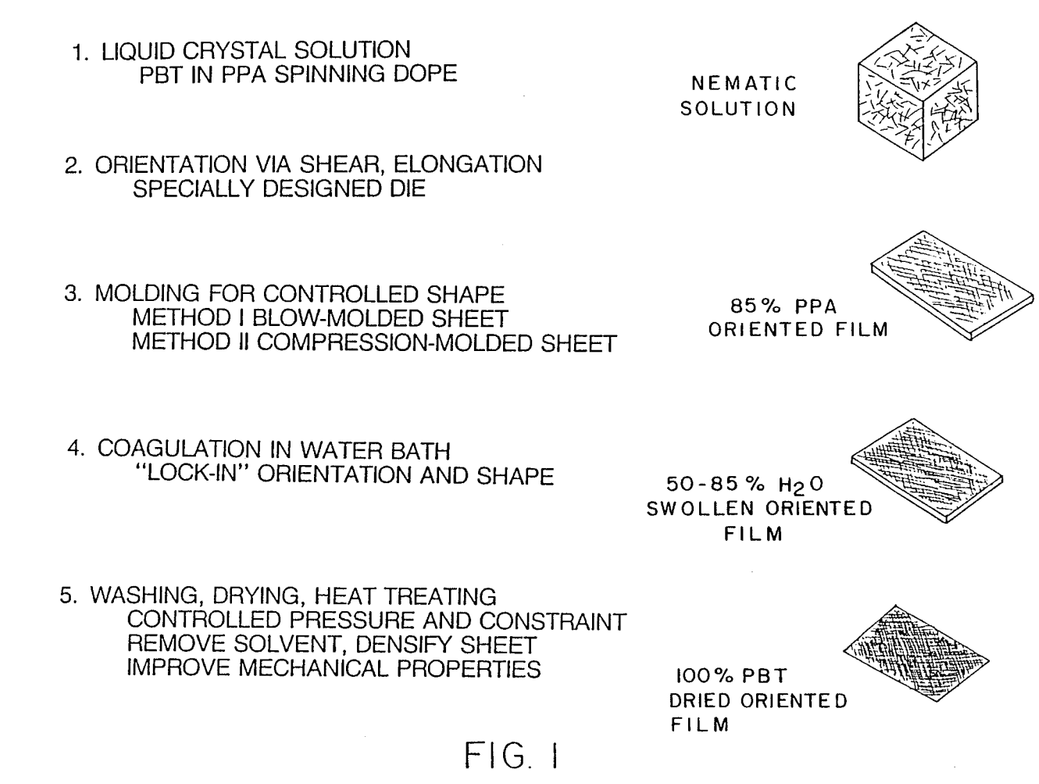
FIG. 1 shows the preferred film processing steps for the formation of the PBT film of the present invention.

FIG. 1 shows the preferred film processing steps of the PBT film used in the present invention.

During the orientation step, the rod-like molecules are formed into a microfibrillar network with homogeneity down to a very fine scale. It has been discovered that the dimensions of this microfibrillar network are on the order of about 100A. Thus, the self-reinforced material will appear continuous to the relatively large electronic components, printed conductors and other features of the electronic package.

After the PBT film has been finished by drying and heat treatment, the mechanical properties are consistent and repeatable and the film shows excellent environmental stability including low moisture pickup (less than 0.5 percent by weight after 24 hr. immersion at 25°C.)

The completely processed films are thermoset; that is, they cannot be further formed by application of heat and pressure. In fact, tests of tensile strength at 300° C. indicate that the materials retain 75 percent of room temperature properties, (Thomas et al., "Mechanical Properties Versus Morphology of Ordered Polymers," Vol. II, Technical report AFWAL TR 80-4045, July 1981).

Biaxial film processing techniques have been developed which result in films having a specific, controllable molecular orientation in the plane of the film. X-ray diffraction studies have shown a high degree of order through the thickness of the films, confirming that the molecules lie predominantly in the film plane. This work also shows that orientation within the plane can be either random (planar isotropic) or in various directions as shown schematically in FIG. 2.

Figure 2:
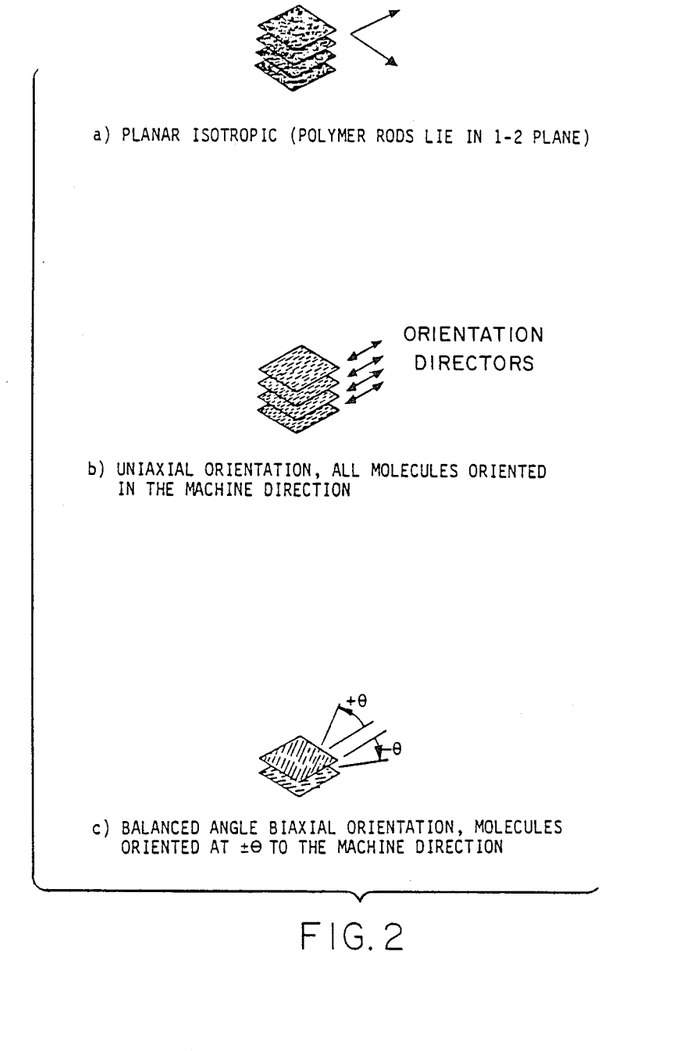
FIG. 2 illustrates schematically the morphology of oriented single layer PBT films.

In the extreme case, all molecules are oriented in the machine direction (the direction of film advance during processing), a situation called uniaxial orientation, shown in FIG. 2(b).

Biaxially oriented films having the morphology shown in FIG. 2(c), i.e., where the principal orientation direction are $\pm 0$ to the machine direction are also possible.

The illustrated continuous single layer film morphology is somewhat idealized, as some molecules will have orientations between these two directions, as well as out of the plane of the film. However, this ideal biaxial orientation serves as a good approximation, and can be used as a model to describe the CTE behavior of biaxially oriented films.

In the present invention, the model biaxial film comprises hypothetical uniaxial plies of PBT, analogous to fiber-reinforced plies in a composite. Such uniaxial PBT plies would have both longitudinal and transverse properties to account for both the primary direction and random distribution of molecules in the plane of the film.

The negative CTE of PBT film in the primary orientation direction is similar to that noted for PBT fibers as well as other high modulus fibers including graphite, polyaramid (Kevlar) and ultra-drawn polyethylene (Porter et al., "Concerning the Negative Thermal expansion for Extended Chain Polyethylene," *Journal of Thermal Analysis*, Vol. 8, pp. 547–555 (1975).

These high modulus fibers exhibit a negative CTE in he axial direction, and positive CTE in the transverse direction. When these fibers are used in conjunction with a positive CTE matrix material (such as epoxy or polyimide), the net thermal expansion can be tailored to the 3 to 7 ppm/°C. desired for PWB substrates. This may be done by controlling the fiber-to-resin ratio and cross-plying the unidirectional fiber layers. PBT films have no matrix component, but the negative CTE in the transverse direction.

• In the simplest model of a biaxial film, two hypothetical uniaxial plies are oriented at $\pm i$ to the machine direction, approximating the actual orientation of PBT biaxial films. When i=0, this degenerates to the uniaxial case, and when i=45 deg. the longitudinal (machine direction) and transverse properties are equal like a cross-plied fiber-reinforced composite.

Figure 3A:
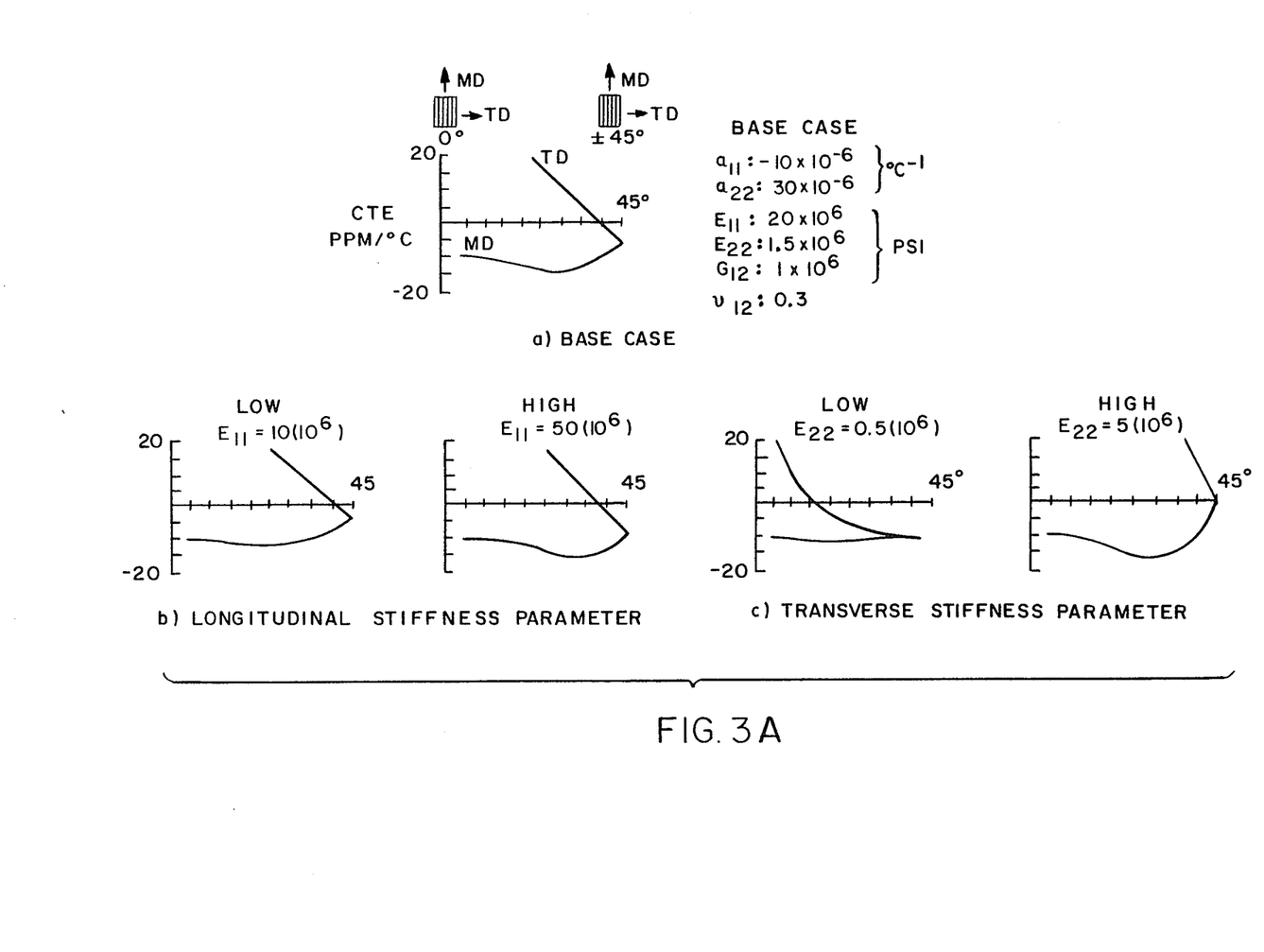
FIG. 3A and 3B show the predicted CTE behavior as a function of i.
Figure 3B:
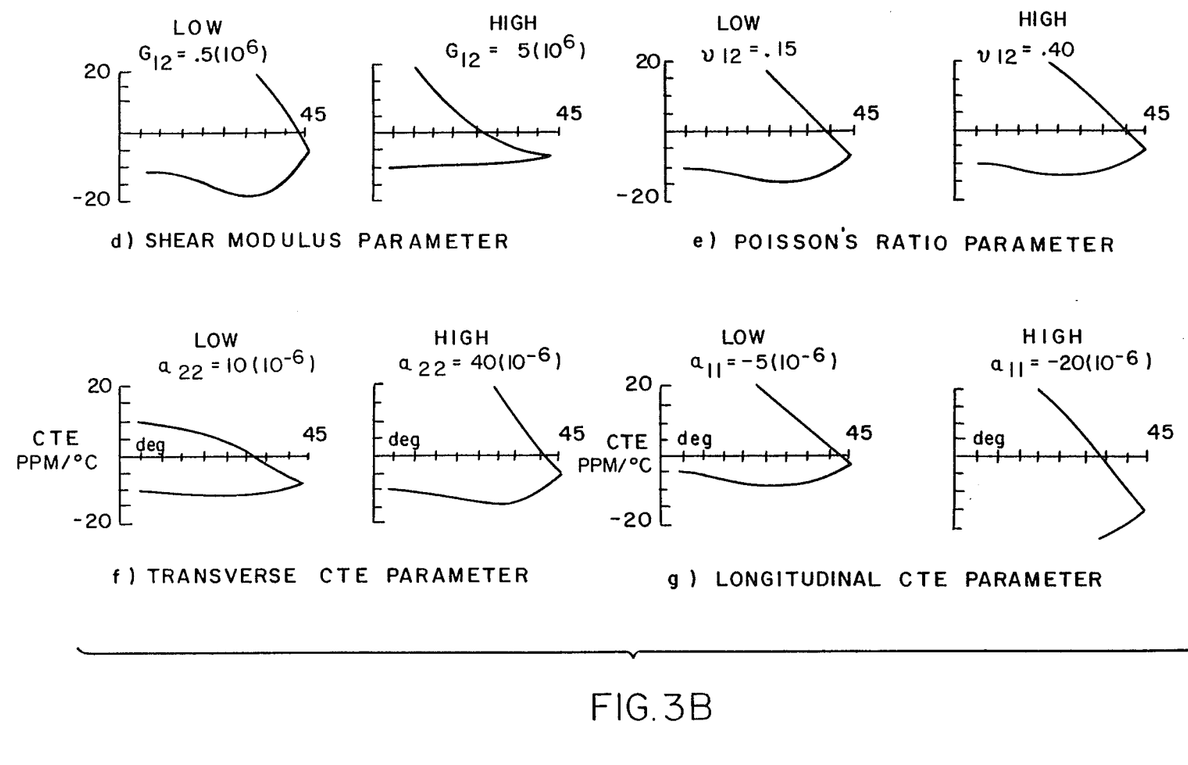

FIG. 3 shows the predicted CTE behavior as a function of i. The calculations were made based on laminated plate theory (J. C. Halpin, *Primer on Composite Materials: Analysis*, Technomic, (1984), and show the effect of the various parameters with respect to the base case.

Because of the very high longitudinal stiffness of the PBT rod-like molecules, even the $\pm 45$ degree film calculations show a negative CTE in the plane of the film (isotropic negative CTE behavior). Thus the PBT film is analogous to the negative CTE fiber, but exhibits this in two dimensions rather than one, making isotropic planar reinforcement possible.

PBT films exhibit a negative CTE in the plane of the film. This behavior can be used to counteract the positive CTE of copper conductors, ground planes, thermal control layers, and resin used to bond the MLB together.

Figure 4:
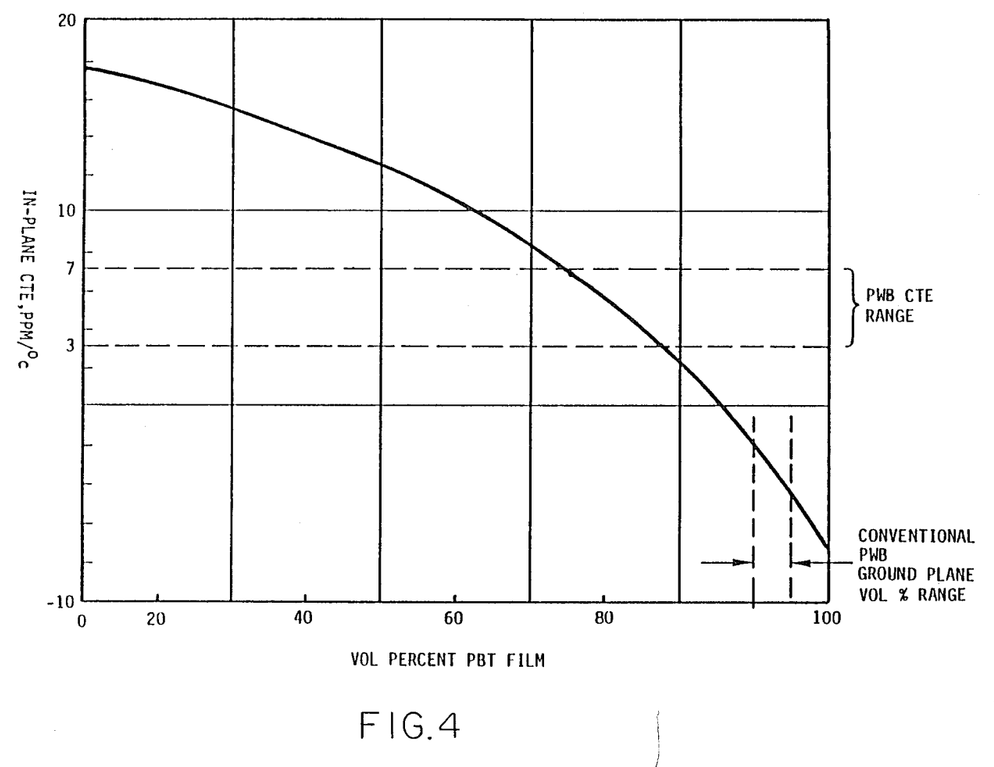
FIG. 4 is a graph of CTE as a function of the percentage of PBT film (corresponding to 35 to 23 percent copper) is needed to fit into the 3 to 7 ppm/°C. range.

FIG. 4 is a graph of CTE as a function of the percentage of PBT film (corresponding to 35 to 23 percent copper) is needed to fit into the 3 to 7 ppm/°C. range: Conventional PWBs contain about 5 to 10 percent copper; thus, if PBT were substituted directly on a volume basis, the resulting board would be below the desired range.

However, because of the high strength and stiffness of PBT film, less material will be needed in relation to the same amount of copper. A properly designed PBT substrate could support more copper than conventional substrate materials, making the finished MLB smaller and lighter. Advantageously, the relative copper content could be form about 20 to 30 percent, bringing the overall in-plane CTE into the desired range.

The overall MLB thickness can be substantially reduced by using thin PBT films. E-glass/epoxy fabric-reinforced PWBs are limited to about 4 to 5 mils thickness because of yarn diameter and weave. PBT films 1 to 2 mils thick could support the same copper layers as the E-glass boards, but at one-fourth to one-half the thickness.

High speed circuits with switching frequencies in the gigahertz (GHz) range will be limited by the speed of propagation which is a function of the dielectric constant. A dielectric constant of less than about 3.0 is required for such advanced applications. This will also reduce line capacitance and the power required to drive devices. A low dissipation factor (less than about 0.010) is needed to minimize loss of signal into the substrate.

Dielectric property measurements made in PBT film were run in accordance with ASTM D-150 by Trace Laboratories in Maryland.

Their results show that PBT film has dielectric properties that are attractive for high speed circuit applications. The only material with a dielectric constant and dissipation factor significantly lower than PBT is polytetrafluoro ethylene (PTFE), but thermal expansion, stiffness and bonding problems preclude its use.

In order to realize the benefits of the low dielectric constant of PBT, it will be necessary to use a low dielectric constant resin. Some modified epoxies (e.g., acetylene terminated and bismaleimide-triazine blends) show promise.

Biaxially oriented films of other lyotropic liquid crystal polymers can be produced by the same techniques used to prepare PBT films. Other ordered polymers such as polybenzoxazole (PBO), and PBX polymers (wherein X represents novel polymer structures akin to PBT and PBO, including molecular side chain modifications which may improve compressive strength) may be formed into films and used herein as PWB substrates.

It is anticipated that these materials can be formed into biaxially oriented films that might exhibit better compressive strengths than the PBT films without any significant reduction in tensile and modulus. Good electrical properties should be retained.

Figure 5:
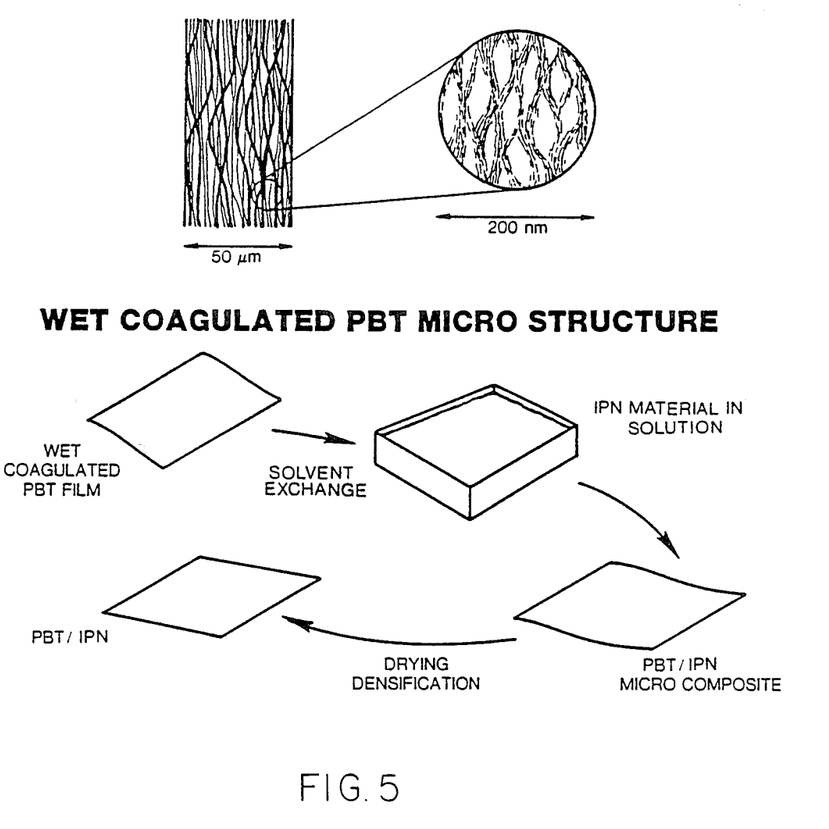
FIG. 5 illustrates the interpenetrating network (IPN) films and the basic processing steps for producing them.

Modified films of the PBT and other lyotropic ordered polymers can be produced by a novel process which involves introducing a second material into the fibrillar microstructure of the polymer film when it is still in the water-swollen state as described herein. These interpenetrating network (IPN) films and the basic processing steps for producing them are described in FIG. 5.

This modification will produce films with improved compressive strength and interlaminar adhesion as compared to the neat film form without any significant sacrifice in tensile or modulus properties.

Two-phase interpenetrating network (IPN) materials made by infusing the PBT microstructure with another polymer (molecular composites are another two-phase material with rod-like molecules reinforcing a coil-like matrix polymer).

Several films which demonstrated improved laminating characteristics as compared with the neat PBT films when using epoxy adhesives included tetramethoxysilane (TMOS); tetraethoxysilane (TEOS); glycidyloxypropyl trimethoxysilane (GPTMOS); methacryloxypropyl trimethoxysilane (MPTMOS); methyl trimethoxysilane (MTMOS); and dimethyldimethoxysilane (DMDMOS). These materials will be useful in creating multilayer PWB constructions.

The IPN approach can be viewed as a way of "prepregging" PBT film which will show benefits in improved flexural stiffness, better interlaminar adhesion and strength, improved surface adhesion for mounting components and plating conductors, and reduced voids and defects.

The present invention will be further illustrated with reference to the following examples which aid in the understanding of the present invention, but which are not to be construed as limitations thereof. All percentages reported herein, unless otherwise specified, are percent by weight. All temperatures are expressed in degrees Celsius.

EXAMPLE 1

CONTROLLABLE CTE

PBT film was tested in accordance with ASTM D-696 and shown to have a low negative CTE, in the range −7 to −8 ppm/°C., depending on film orientation. This film can be used in advanced PWB designs to achieve lighter weight and more densely packed substrates than current materials.

Experimental values of CTE were determined using a quartz tube dilatometer (Perkin-Elmer TMS-2).

Thin strips of film (1 mm × 10 mm, 0.039 in. × 0.39 in.) were cut from biaxially oriented PBT in the machine and transverse directions. These strips were mounted between copper pins, as shown, and thermally cycled over the temperature range −65° to +125°C.

Table I summarizes the results for PBT film.

TABLE I

| Film Orientation | Coefficient of Thermal Expansion ppm/°C. | |
|---|---|---|
| | machine dir. | transverse dir. |
| Uniaxial tape | −15 | +30 |
| Biaxial film primary orientation at ± 11 degrees | −14 | +4 |
| Biaxial film primary orientation at ± 19 degrees | −10 | −8 |
| Biaxial film primary orientation at ± 43 degrees | −7 | −5 |

Figure 6:
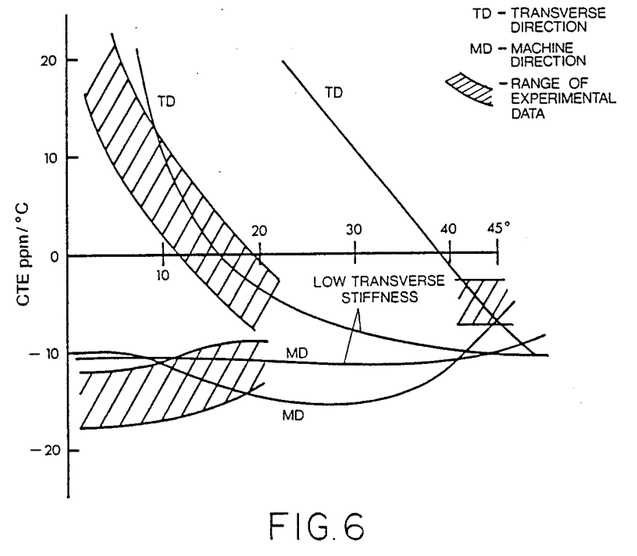
FIG. 6 is a plot of CTE as a comparison of the experimental data from Table I and the CTE Analysis.

When plotted in FIG. 6, these results agree with the analytical model for the low transverse stiffness case. This suggests that actual PBT film transverse stiffness is lower than that estimated for the base case. At low orientation angles, PBT film shows a negative CTE in the machine direction and positive CTE in the transverse direction. From ±11 to ±19 deg., the transverse CTE goes from positive to negative, as predicted by the model. For ±43 deg. the measured CTE is negative in both the machine and transverse directions, these results show good agreement between the balanced angle ply model and experimental data.

Other forms of oriented PBT film are possible, and can be exploited to alter CTE. The planar isotropic morphology shown previously in FIG. 2(a) has been produced by pressing PBT dope between two counter-rotating plates. The combination of radial flow and circumferential shear acts to produce molecular orientation in many directions, rather than just two. CTE measurements on this type of film have fallen in the range of −5 to −1 ppm/°C.

Other properties of PBT have an effect on CTE, including molecular structure. Also, other rod-like polymers such as poly p-phenylene benzobisoxazole (PBO) may have different CTE.

The use of PBT together with other PWB components will produce an overall CTE of from about 3 to 7 ppm/°C. which can be tailored by design of the PWB construction.

EXAMPLE 2

BONDABLE COPPER LAYERS

PBT film can be coated with copper by ion plating using a modified sputtering system, or by chemical electroless plating techniques. The copper layers can be plated up to desired thickness, then etched.

This method was demonstrated on samples of PBT films with thicknesses between 15 and 20 microns. These films were clamped within a 75 mm diameter copper ring for application of the initial copper layer. This assembly was placed in the vacuum coating chamber above a copper magnetron source.

Several samples were cleaned and coated according to the following process. The chamber was pumped down and back filled with argon to about 10f absolute pressure at which time a glow discharge was established near the sample surface for cleaning purposes. A discharge ion current density of approximately 50 mA was established for a 2 min cleaning cycle.

Simultaneously, the shuttered magnetron was started to remove residual surface contamination. After cleaning, the shutter was removed allowing copper film growth to occur on the exposed film surface. Coating continued with a biased substrate for a period of 15 min. The calculated deposition rate was about 1 micron/5 min. to form a copper coatings up to about 7 microns thick. The films were evaluated "as coated" and after electroplating of additional copper.

EXAMPLE 3

BONDABLE MULTILAYERS

PBT films can be bonded together with epoxy or polyimide adhesives. Surface etching techniques may be used to promote adhesion.

PBT films can be used to provide a thin, homogeneous continuous reinforcement for advanced PWB substrates which match the CTE of alumina. The negative CTE and high stiffness CTE of adhesive resin layers, ground planes, and thermal control layers.

The PBT film of the present invention has been coated with highly adherent copper layers by two techniques:

Ion plating involving the ionic transfer of copper from a solid by sputtering and subsequent deposition on the PBT film substrate by atomic and ionic bombardment.

electroless plating wherein a catalyst is applied to the PBT film, with subsequent deposition of copper from an electroless plating solution.

Both techniques produce coatings up to 5 microns thick. Thicker copper cladding suitable for conductors (over 25 microns) can be made by conventional electroplating over the thinner coatings.

EXAMPLE 4

IONIC TRANSFER OF COPPER

Figure 7:
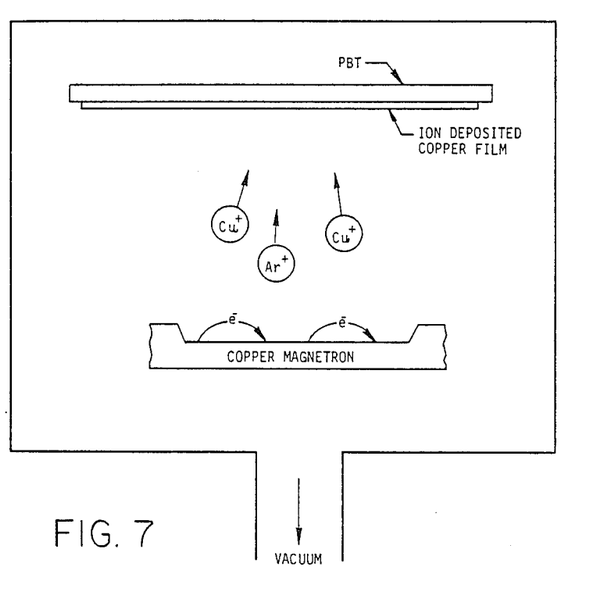
FIG. 7 illustrates the process of ion deposition of copper on PBT.

Copper was deposited on both sides of a PBT film by the process shown schematically in FIG. 7. The process involves treatment of the PBT surface to perform two functions. First, the surface chemistry is changed from the bulk polymer to provide more sites for chemical bond formation. Second, the surface is micro-etched by the process to increase effective surface bonding area.

Since the pretreatment stage occurs under vacuum conditions, a reactive and void free surface is available for subsequent copper deposition by ion plating.

Ion plating involves ionic transfer of copper from a solid by sputtering and subsequent deposition by atomic and ionic bombardment. Solution of the bonding problem will allow fabrication of multilayer PWBs utilizing the properties of PBT to the fullest advantage. Additionally, conductive path resolution and stability may exceed that of other PWB materials due to the excellent thermal and mechanical stability of the material.

The "as coated" films showed good adherence between the ion-plated coating and the PBT film substrate, as demonstrated by a Scotch tape peel test. The copper could not be removed by attempts to pull it off with the tape. This is because the copper appears to have penetrated the upper PBT film surface, forming a good mechanical bond. The initial plasma etch is needed to prepare the surface for this type of bonding.

EXAMPLE 5

ELECTROPLATING OF COPPER

Electroplating techniques were used on ion plated PBT films to deposit additional copper metal on the surface. Copper sulfate, with and without brighteners, copper pyrophosphate, and copper cyanide baths were evaluated.

The most extensive tests on electroplating PBT film with an ion deposited copper cladding were performed using a brightened acid copper process. The copper sulfate plating solution was purchased from Enthone, Inc. in a prepared solution. The composition contained the following ingredients: $CuSO_4.5H_2O$ (90 g/l); Cu (23 g/l); Sulfuric Acid (114 ml/l); chloride ion (50 ppm); Technic FB Brightener (4m/l). This solution is commonly used in through-hole plating of printed circuit boards. The semibright copper is deposited in low stress, ductile deposits during typical applications.

Anodes used in the process consisted of 0.03 to 0.06 percent phosphorized copper. The anode area was 10 in., well in excess of the recommended 1.5 to 2.5 times cathode area. Anode bags were not used. Air agitation was vigorous and was adequate to induce motion of ions and prevent anode deposits from forming. Bath temperature was maintained at room temperature.

Specimens of ion plated copper-PBT were mounted with tape on acid cleaned copper rods bent to form circular holders. Electrical continuity was checked to assure contact through the specimen and rod. An electrolytic cell was set up to allow measurement of current during deposition. Typical current density was 30 A/ft., though lower values were also used.

Attempts to produce a thick copper layer by electroplating were not totally successful using the copper ion plated samples. Although a thick copper layer was deposited on copper PBT samples, the layer peeled off easily from the PBT film when it was removed from the bath. This problem can be solved by changing the chemical constituents, voltage and current used in the bath. This is supported by successful electroplating results achieved using PBT film samples with thin electroless plated copper layers, as described below.

EXAMPLE 6

ELECTROLESS COPPER PLATING

Electroless copper plating was evaluated as an alternative to the modified sputtering technique previously described.

PBT films were successfully plated with copper, and this technique should be further evaluated, especially for plating through holes in the MLB stack.

Since the early 1960s when electroless plating of holes for connecting double-sided circuit boards began to replace mechanically inserted eyes, the technology of electroless plating on dielectric substrates has rapidly evolved. Complex multi-layer constructions are possible because of these advances.

Improved electroless plating methods now make possible extremely fine conductor lines and spaces together with vias and spacing to match. The practical lower limit of today's subtractive circuit technology is 4 mil (0.004 in.) wide copper conductors and 4 mil spaces. The reason for this is that the subtractive process involves etching away copper which under-cuts the photoresist, and cannot be used reliably to make very thin conductors.

Electroless plating is an additive process which avoids undercutting. New electroless plating materials and processes currently under development promise 0.5 mil (0.005 in.) lines and spaces, and 0.5 to 1.0 mil diameter vias.

This translates to a MLB with several orders of magnitude higher density and improved performance over present technology. PBT ordered polymer films are leading candidates for thin dielectric substrates in the next generation of interconnect technology. The successful electroless plating of the PBT film demonstrated herein is a key step toward this goal.

Copper was deposited on both sides of PBT film using techniques similar to those in common use by the printed wiring board industry. First, the film was immersed in a concentrated sulfuric acid bath to prepare the surface for catalyzation. The ordinary chromic acid bath used to etch other polymers did not yield satisfactory results with PBT. Immersion for 30 sec. at room temperature produced sufficient "softening" or swelling of the fibrillar structure at the surface of the PBT film.

A tin-palladium catalyst was then applied while the film was still wet from the acid bath. If the film was allowed to dry after the acid bath, it was not possible to achieve reasonable adhesion of the catalyst to the PBT film. We conclude that the $H_2SO_4$ bath opens the microstructure of the surface of the film sufficiently to promote penetration of the catalyst solution. If the film was left immersed in the concentrated $H_2SO_4$ longer than about 40 sec, permanent degradation of the film was observed. A process window of from 20 to 40 sec. appears to be achievable.

After treatment with the catalyst the PBT film was immersed in an electroless plating bath formulated by Shipley Chemical Company. The bath consisted of copper salts, formaldehyde, and hydroxide mixtures together with proprietary stabilizing compounds and other additives to promote ductility for the plated copper. The films were electroless plated according to the following basic chemical reaction:

The copper clad film was allowed to air dry while being simply supported in a ring so that the film was taut and creaseless. The electroless plated films exhibited good adherence between the copper and the PBT film substrate as demonstrated by a Scotch tape peel test. Copper remained bound to the PBT surface except when the peel force was directed along the corresponding fibril direction on the surface.

In the case of adhesion failure upon peeling along the fibril direction, both copper and PBT were removed. The copper appeared to have permeated the surface layers of PBT, resulting in increased adhesion.

Electrolytic techniques, identical to those described previously, were used to increase the copper thicknesses to 11 mil (0.001 in.). Unlike the ion deposited primary layer, the electroless copper supported and promoted an integral layer of copper at the desired thickness a photoresist was applied, developed, and etched to yield peel-test specimens. The highest values of 2.5 to 4.0 lb/in. resulted from specimens etched in sulfuric acid for 40 sec.

Specimens left in the acid-bath in excess of 1 min. tested at 0.9 to 1.7 lb/in. While not wishing to be bound by theory, it is believed that the acid swells the polymer's surface, allowing permeation and mechanical adhesion to occur.

The surface of PBT is partially attacked by the strong acid, but the argon plasma used in the ion plating work does not attack the highly smooth surface texture of PBT film enough to promote mechanical adhesion. When the combined stresses of electrolytic deposition are added to the copper-primed surface, the acid-etched, electrolessly-deposited specimens survive, while the plasma-etched, ion-deposited specimens fail.

EXAMPLE 7

PREPARATION OF A MULTILAYER BOARD

Based upon the above described experiments, it has been determined that the fabrication of a PBT film substrate MLB will require bonding layers of film in the following sequence:
1. The PBT film is coated with copper and etched to form the circuit.
2. An adhesive is used to bond multiple circuit layers which are registered to align the vias.
3. The board is drilled to form holes for vias and the vias are plated.
4. Ground plane and thermal control layers are added as required.
5. DSM components are attached.

Adhesives for such a process have been evaluated and used successfully for PBT film. First a surface treatment is required to make the PBT "wettable." Both oxygen plasma and dicromate-acid etch have been used to promote adhesion. Epoxy and polyimide resins (Thermid IP 600) have been used to bond PBT, suitable for steps 2, 4 and 5, above.

The present invention has been described in detail, including the preferred embodiments thereof. However, it will be appreciated that those skilled in the art, upon consideration of the present disclosure, may make modifications and/or improvements on this invention and still be within the scope and spirit of this invention as set forth in the following claims.

What is claimed is:

1. A method of forming a multilayer PWB substrate, comprising bonding together several poly-benzobisthiazole film layers, none of which exceeds about 0.0025 inches in thickness, thereby forming a multilayer board having a plurality of laminated poly-benzobisthiazole film layers 2. As an article of manufacture, a printed wire board substrate prepared from a molecularly oriented lyotropic liquid crystalline polymer film.

3. The printed wire board substrate of claim 1, which further has the following characteristics:
    (a) is non-electrically conducting; and
    (b) has low-moisture absorption.

4. The printed wire board substrate of claim 3, wherein the molecularly oriented polymer is poly-benzobisthiazole.

5. The printed wire board substrate of claim 4, which further comprises a copper layer bonded thereto.

6. The printed wire board substrate of claim 4, wherein the poly-benzobisthiazole has the following additional property:
    tailorable coefficient of thermal expansion (CTE) (X-Y direction) in range of from about 3 to $7 \times 10^{-6}$ in./in./°C.

7. The printed wire board substrate of claim 5, wherein the poly-benzobisthiazole has the following additional property:
    CTE of thickness (Z direction) approaching that of copper.

8. The printed wire board substrate of claim 4, wherein the poly-benzobisthiazole has the following additional property:
   low-moisture absorption, i.e., not exceeding about 0.5 percent at saturation.

9. The printed wire board substrate of claim 4, which further comprises a plurality of ordered polymer layers, making up a multilayer laminated board.

10. The printed wire board substrate of claim 9, which further comprises a copper layer bonded thereto.

11. The printed wire board substrate of claim 9, wherein the poly-benzobisthiazole has the following additional property:
   maximum thickness of a single layer not exceeding about 0.0025 in.

12. The printed wire board substrate of claim 9, wherein the poly-benzobisthiazole has the following additional property:
   interlaminar shear strength greater than glass/Kerimid 601 or equal to glass/epoxy.

13. The printed wire board substrate of claim 9, wherein the poly-benzobisthiazole has the following additional property:
   flexural strength equivalent to glass/polymide.

14. The printed wire board substrate of claim 9, wherein the poly-benzobisthiazole has the following additional property:
   dielectric constant not exceeding about 3.5 over the functional frequency range of 1 kHz to 500 MHz.

15. The printed wire board substrate of claim 9, which is capable of being employed as a high density leadless perimeter and in grid array ceramic chip packages.

16. The printed wire board substrate of claim 15, wherein the chip package density requirements include 0.020-in. centers with up to 300 input/outputs (I/Os) for perimeter type packages and 0.050-in. center grid array type packages with up to 240 I/Os per device.

17. The copper coated PWB substrate of claim 5, wherein the copper has been deposited by means of plasma coating.

18. The copper coated PWB substrate of claim 5, wherein the copper has been deposited by means of ion plating.

19. The copper coated PWB substrate of claim 10, wherein the copper has been deposited by means of plasma coating.

20. The copper coated PWB substrate of claim 10, wherein the copper has been deposited by means of ion plating.

* * * * *